(12) United States Patent
Duriez et al.

(10) Patent No.: US 9,711,608 B1
(45) Date of Patent: Jul. 18, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Blandine Duriez, Brussels (BE); Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/173,222

(22) Filed: Jun. 3, 2016

(51) Int. Cl.
| | | |
|---|---|---|
| H01L 21/338 | (2006.01) | |
| H01L 29/423 | (2006.01) | |
| H01L 29/66 | (2006.01) | |
| H01L 29/78 | (2006.01) | |
| H01L 29/06 | (2006.01) | |
| H01L 29/165 | (2006.01) | |

(52) U.S. Cl.
CPC .... *H01L 29/42392* (2013.01); *H01L 29/0638* (2013.01); *H01L 29/0649* (2013.01); *H01L 29/165* (2013.01); *H01L 29/6653* (2013.01); *H01L 29/66545* (2013.01); *H01L 29/66795* (2013.01); *H01L 29/785* (2013.01); *H01L 29/7848* (2013.01)

(58) Field of Classification Search
CPC ............. H01L 29/0638; H01L 29/0649; H01L 29/165; H01L 29/6653; H01L 29/66545; H01L 29/66795
USPC ................................ 438/175, 289, FOR. 204
See application file for complete search history.

(56) References Cited

U.S. PATENT DOCUMENTS

2008/0135949 A1* 6/2008 Lo .......................... B82Y 10/00
257/401

* cited by examiner

*Primary Examiner* — Tan N Tran
(74) *Attorney, Agent, or Firm* — McDermott Will & Emery LLP

(57) ABSTRACT

In a method of manufacturing a semiconductor device, a stacked structure of first semiconductor layers and second semiconductor layers alternately stacked is formed over a substrate. The stacked structure is formed into a fin structure. A sacrificial gate structure is formed over the fin structure. The part of the fin structure covered by the sacrificial gate structure is a channel region. The first semiconductor layers are melted by applying heat, thereby removing the first semiconductor layers from the channel region and forming a source/drain region made of a material of the first semiconductor. A dielectric layer is formed to cover the source/drain region and the sacrificial gate structure. The sacrificial gate structure is removed to expose the second semiconductor layers in the channel region of the fin structure. A gate dielectric layer and a gate electrode layer are formed around the exposed second semiconductor layers in the channel region.

20 Claims, 12 Drawing Sheets

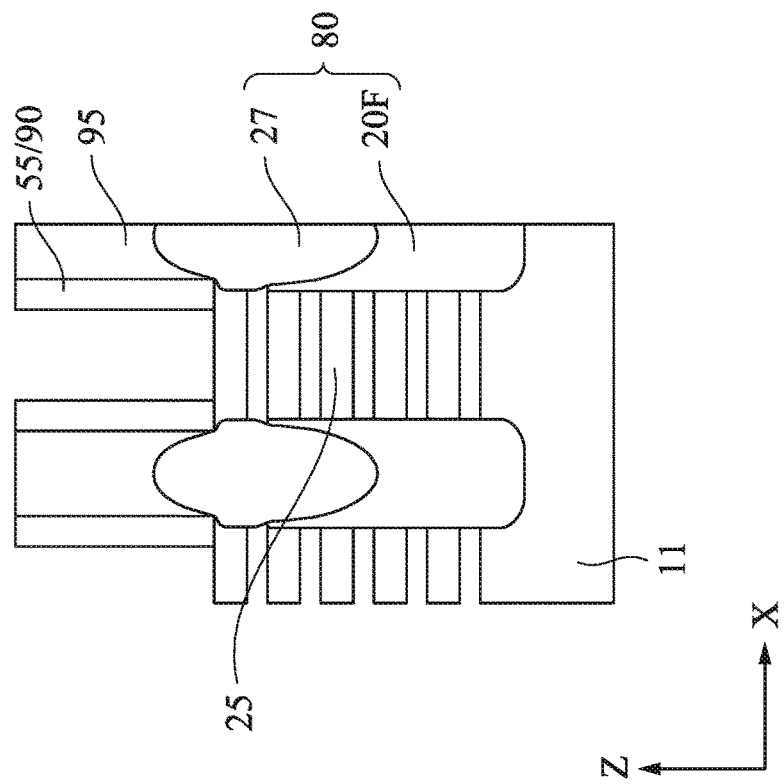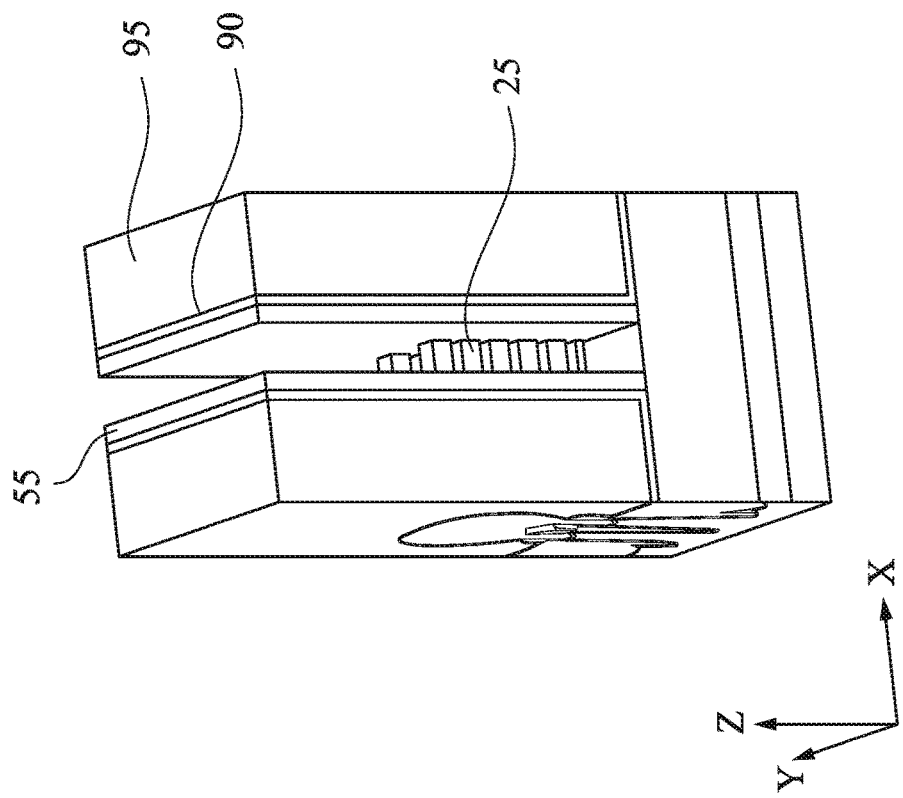

| Material | Melting point (°C) |
|---|---|
| Si | 1414 |
| $Si_xGe_{1-x}$ (x=0.75) | 1367 |
| $Si_xGe_{1-x}$ (x=0.50) | 1273 |
| $Si_xGe_{1-x}$ (x=0.25) | 1129 |
| Ge | 937 |
| InAs | 942 |
| GaAs | 1238 |

FIG. 20

SEMICONDUCTOR DEVICE AND MANUFACTURING METHOD THEREOF

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET having nano-wires. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to a steeper sub-threshold current swing (SS) and smaller drain induced barrier lowering (DIBL).

As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1-19C show exemplary sequential processes for manufacturing the GAA FET device according to one embodiment of the present disclosure.

FIG. 20 shows melting points of some semiconductor materials.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1-19C show exemplary sequential processes for manufacturing the GAA FET device according to one embodiment of the present disclosure. It is understood that additional operations can be provided before, during, and after processes shown by FIGS. 1-19C, and some of the operations described below can be replaced or eliminated, for additional embodiments of the method. The order of the operations/processes may be interchangeable.

Figure 1:
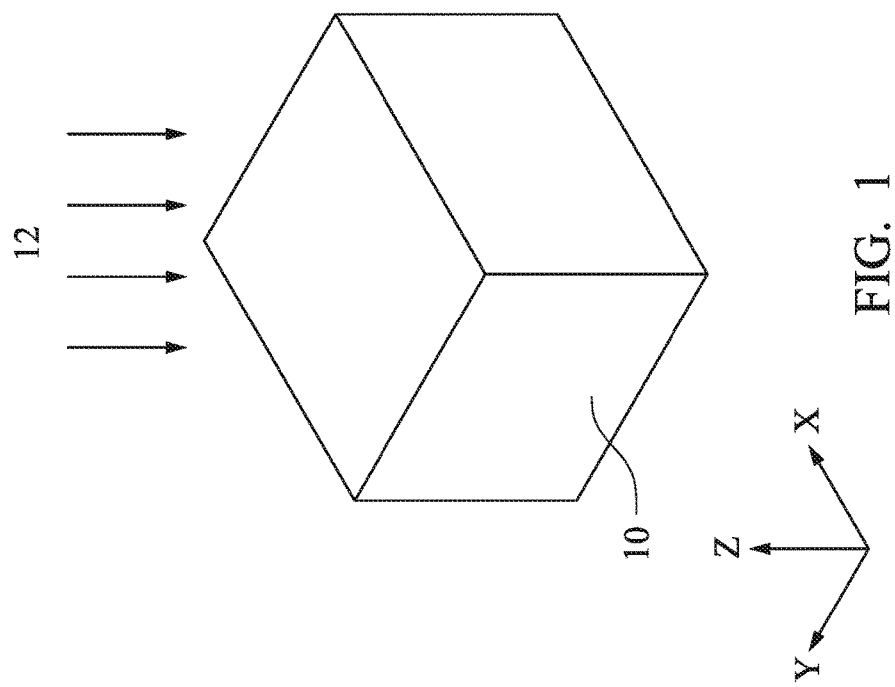

As shown in FIG. 1, a substrate 10 is prepared. In some embodiments, impurity ions (dopants) 12 are implanted into the substrate 10 to form a well region. The ion implantation is performed to prevent a punch-through effect. In other embodiments, the ion implantation is not performed.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers (not shown) epitaxially grown on the silicon substrate 10. The germanium concentration of the SiGe buffer layers may increase from 30 atomic % germanium for the bottom-most buffer layer to 70 atomic % germanium for the top-most buffer layer. Further, in some embodiments, a Ge surface layer (not shown) is further epitaxially formed on the buffer layer on the Si layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
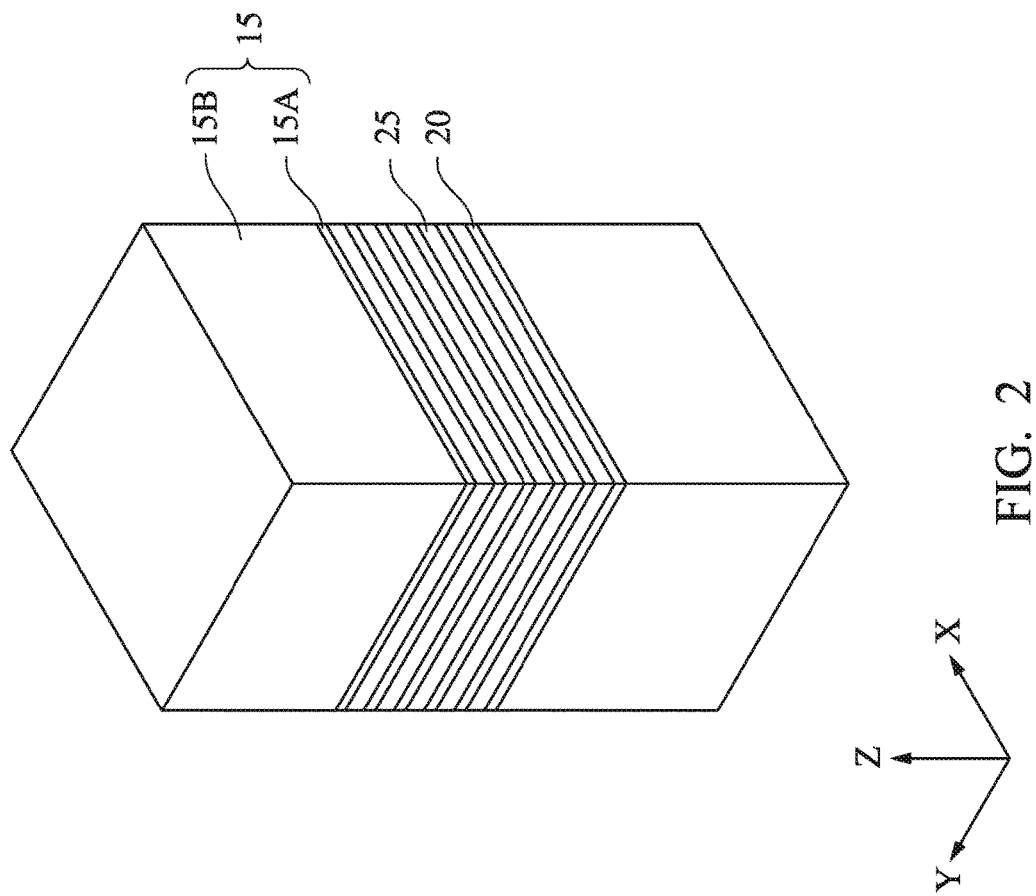

In FIG. 2, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants and different melting points from each other, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In this disclosure, an "M" compound" or an "M based compound" means the majority of the compound is M. In some embodiment, the first semiconductor layers 20 are $Si_xGe_{1-x}$, or Ge (x=0) and the second semiconductor layers 25 are $Si_yGe_{1-y}$, or Si (y=1.0) where x<y. In certain embodiments, the first semiconductor layers 20 are Ge and the second semiconductor layers 25 are $Si_xGe_{1-x}$, where $0.1 \leq x \leq 0.32$. In some embodiments, at least one of the first semiconductor layer and the second semiconductor layer is made of a Group III-V compound semiconductor material.

The melting point of the first semiconductor layers 20 is lower than the melting point of the second semiconductor layers 25. A difference between the melting point of the first semiconductor layers 20 and the melting point of the second semiconductor layers 25 is 20° C. or more. In some embodiments, the difference is 50° C. or more, and yet in certain embodiments, the difference is 100° C. or more. Melting points of various materials are shown in FIG. 20.

In FIG. 2, five layers of the first semiconductor layer 20 and six layers of the second semiconductor layer 25 are disposed. However, the number of the layers are not limited to five, and may be as small as one (each layer), and in some embodiments, 2-10 layers of each of the first and second semiconductor layers are formed. By adjusting the numbers of the stacked layers, a driving current of the GAA FET device can be adjusted. In some embodiments, an uppermost layer in the stacked structure is the second semiconductor layer 25.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 3 nm to about 10 nm in some embodiments, and is in a range from about 4 nm to about 8 nm in other embodiments. The thickness of the second semiconductor layers 25 is in a range from about 1 nm to about 8 nm in some embodiments, and is in a range from about 2 nm to about 6 nm in other embodiments. The thickness of each of the first or second semiconductor layers may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
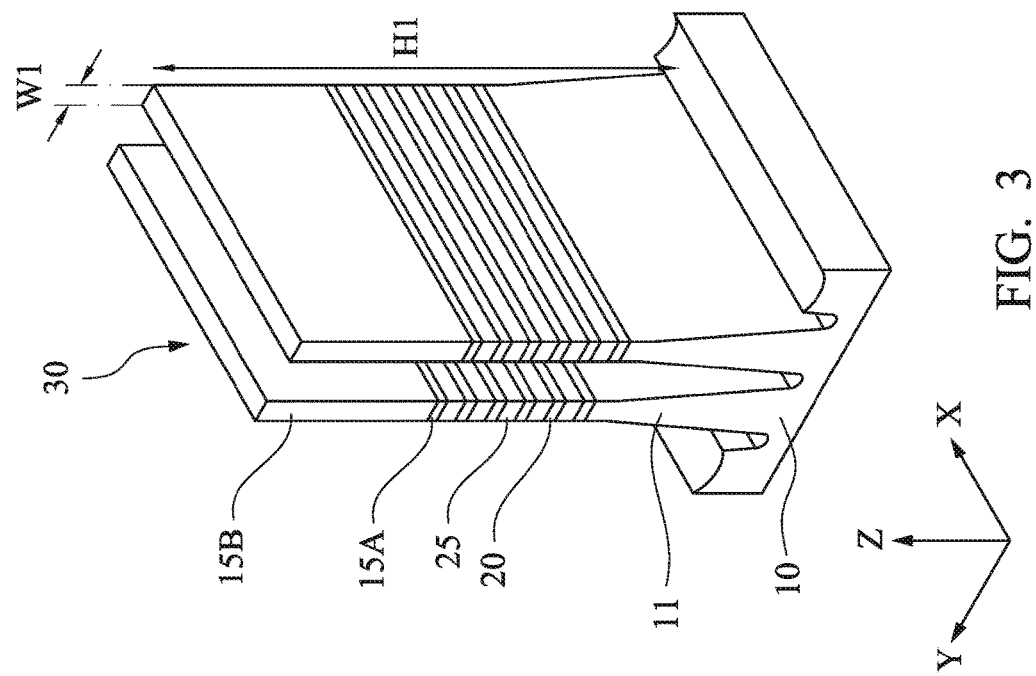

Next, as shown in FIG. 3, the stacked layers of the first and second semiconductor layers 20, 25 are patterned by using the patterned mask layer, thereby the stacked layers are formed into fin structures 30 extending in the X direction. In FIG. 3, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

As shown in FIG. 3, the fin structures 30 have upper portions constituted by the stacked semiconductor layers 20, 25 and well portions 11.

The width W1 of the upper portion of the fin structure along the Y direction is in a range from about 1 nm to about 20 nm in some embodiments, and is in a range from about 2 nm to about 10 nm in other embodiments. The height H1 along the Z direction of the fin structure is in a range from about 100 nm to about 200 nm.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

Figure 4:
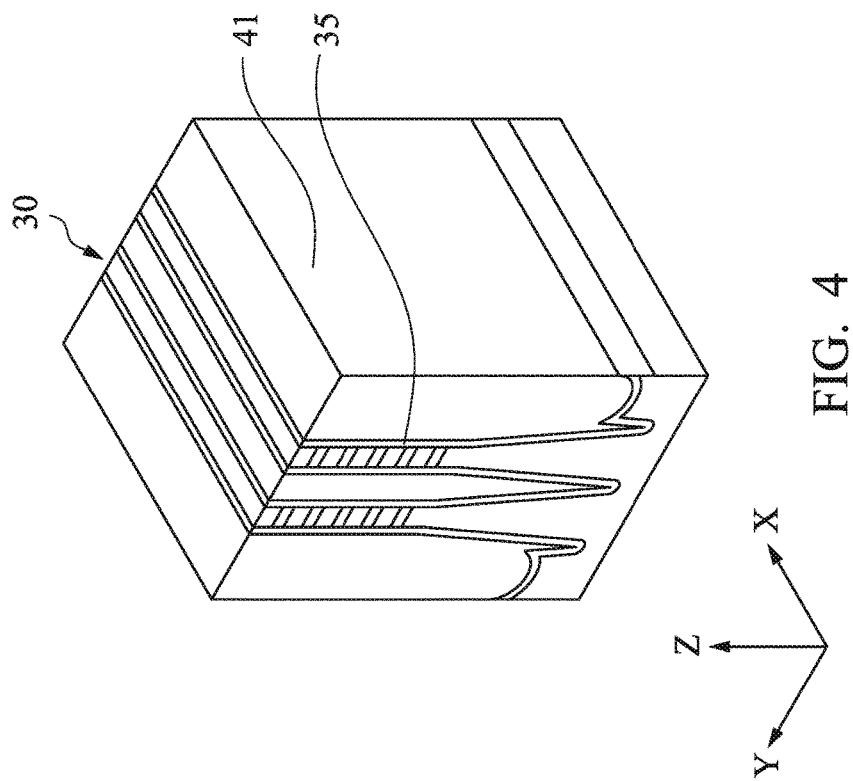

In some embodiments, a first liner layer 35 is formed over the structure of FIG. 3 before forming the insulating material layer 41, as shown FIG. 4, to protect the fin structures from oxidation in the subsequent processes. The first liner layer 35 is made of SiN or a silicon nitride-based material (e.g., SiON, SiCN or SiOCN) in some embodiments.

Figure 5:
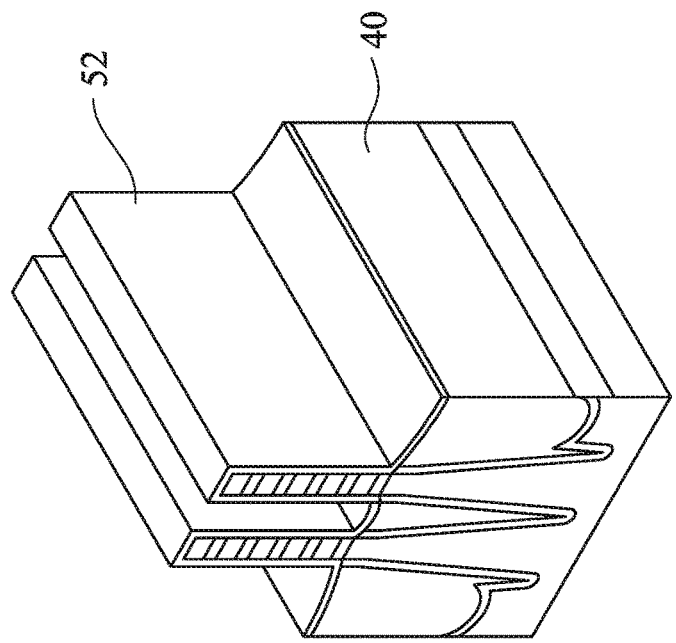

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6:
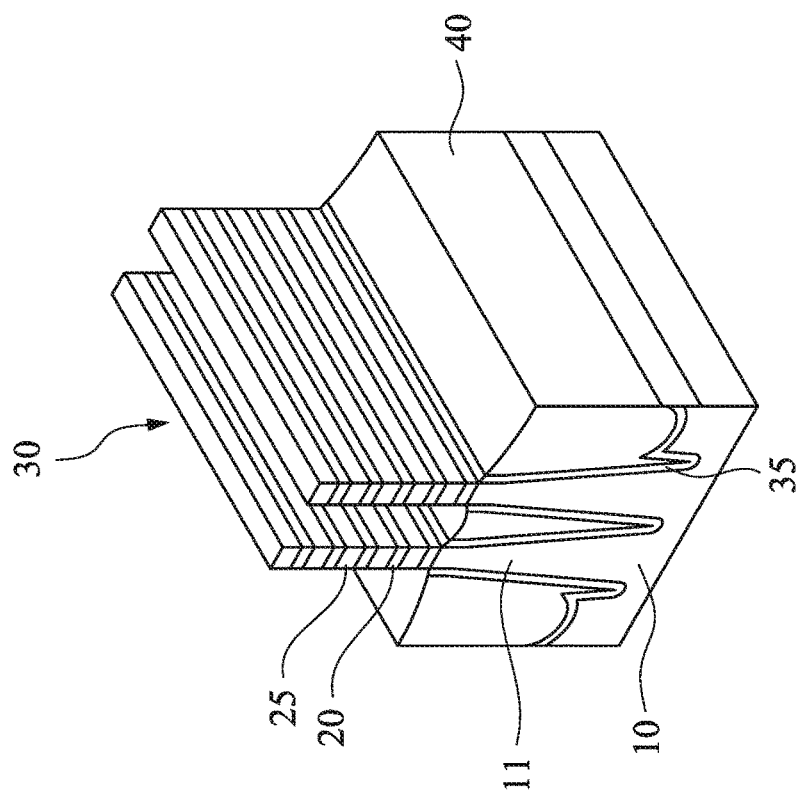

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
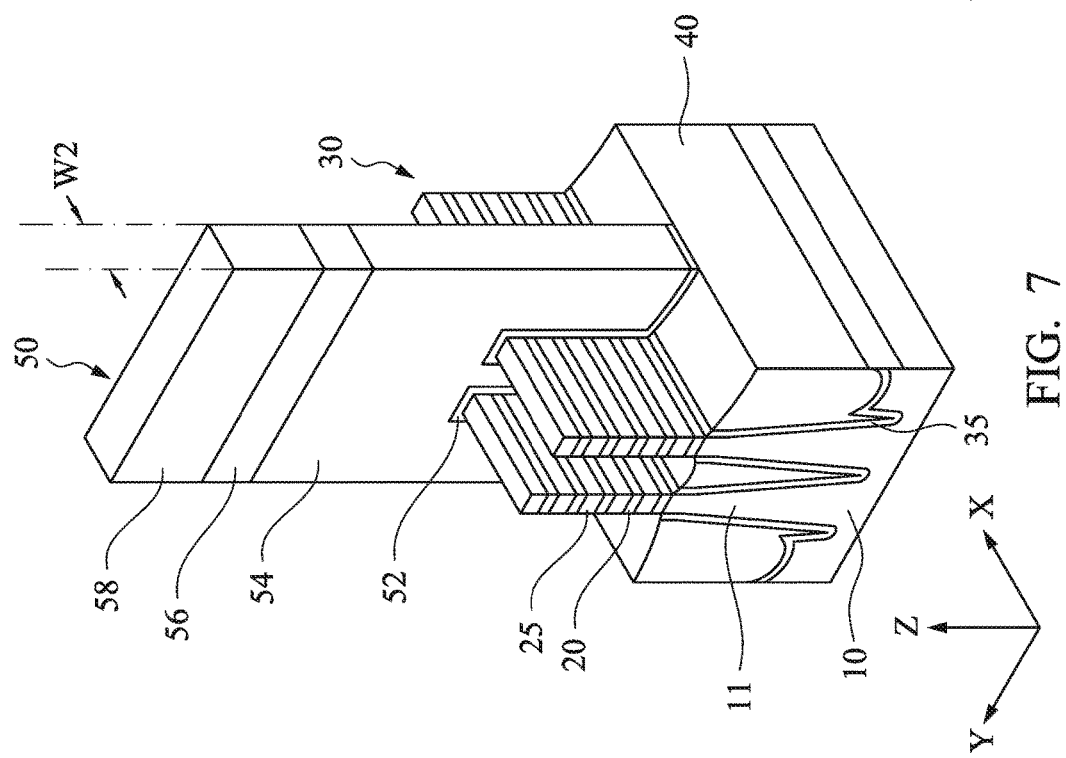

FIG. 7 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures, as shown in FIG. 7. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 7. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity. A width W2 of the sacrificial gate structure in the second direction is in a range from about 5 nm to about 100 nm in some embodiments, and in a range from about 10 nm to about 20 nm in other embodiments.

Figure 8:
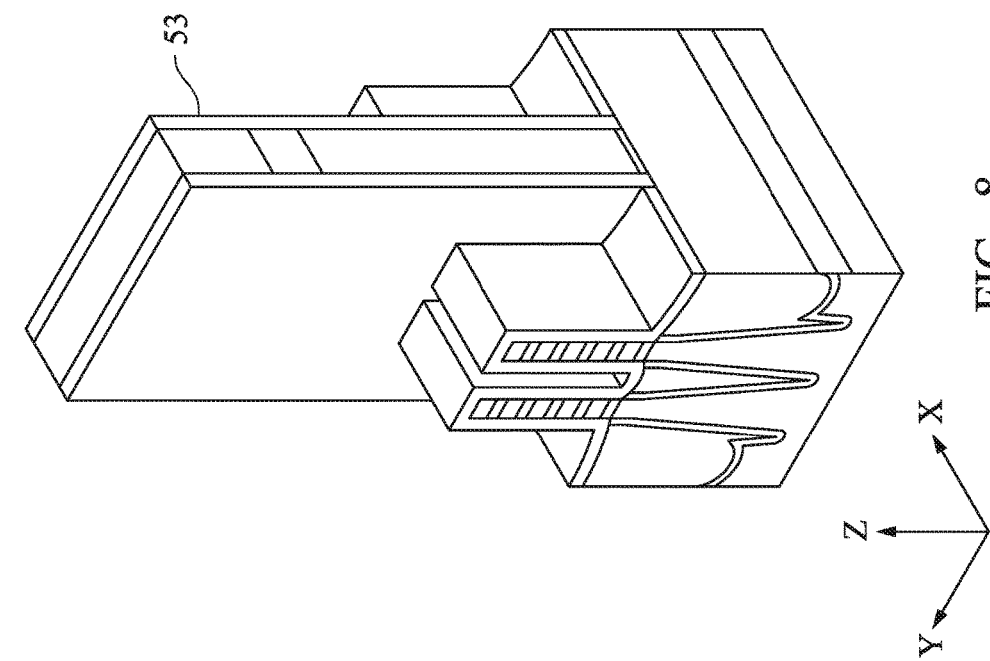

After the sacrificial gate structure is formed, a blanket layer 53 of an insulating material for sidewall spacers 55 is conformally formed by using CVD or other suitable methods, as shown in FIG. 8. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Figures 9A, 9B, 9C:
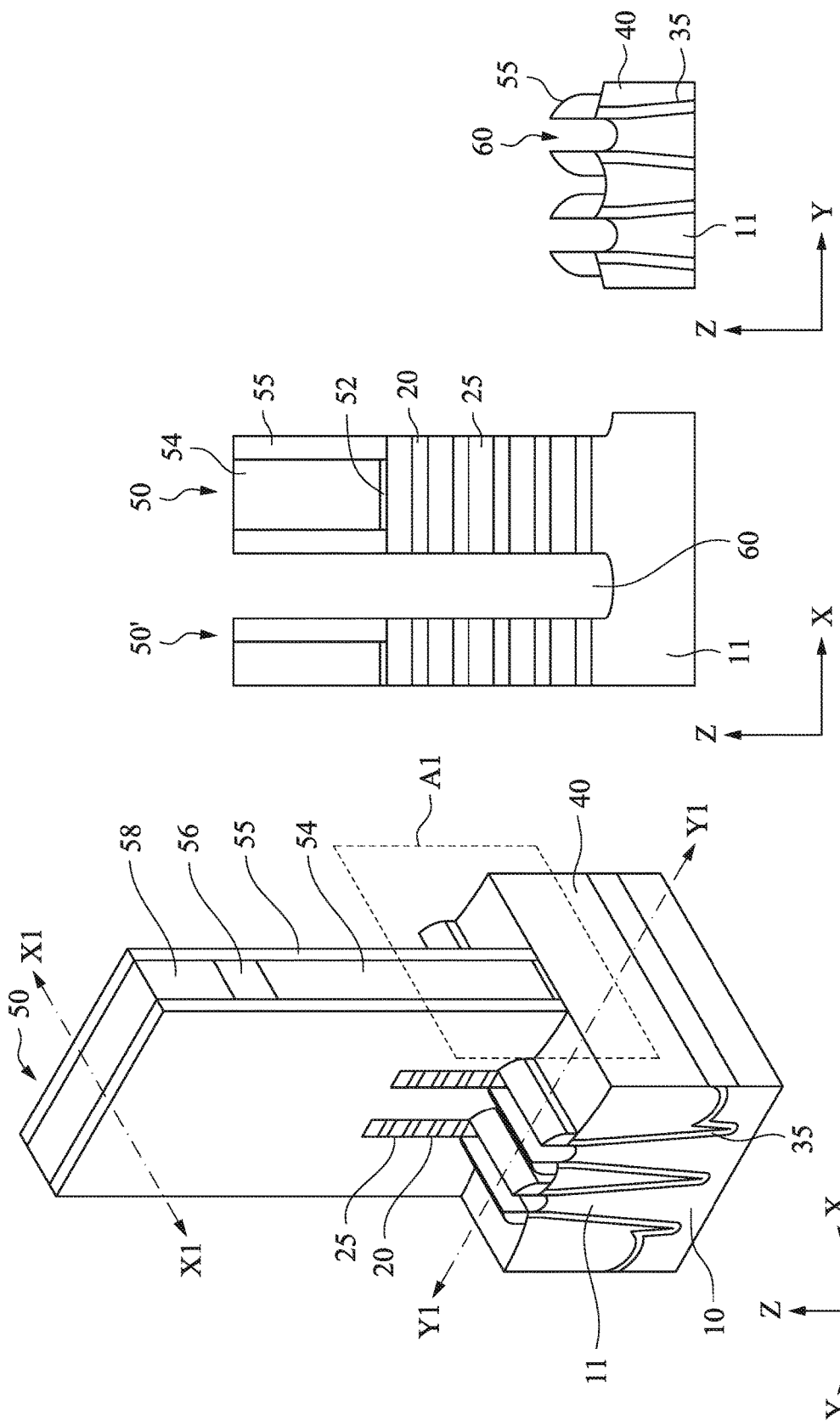

Further, as shown in FIGS. 9A-9C, sidewall spacers 55 are formed on opposite sidewalls of the sacrificial gate structures, and subsequently, the fin structures of the S/D regions are recessed down below the upper surface of the isolation insulating layer 40. FIG. 9B is the cross sectional view corresponding to area A1 and line X1-X1 of FIG. 9A, and FIG. 9C is the cross sectional view corresponding to line Y1-Y1 of FIG. 9A. In FIG. 9B, the cross section of the bottom parts of one sacrificial gate structure 50 and an adjacent sacrificial gate structure 50', which is not shown in FIG. 9A, are illustrated.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIGS. 9A and 9C, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 9B. In some embodiments, the end portions of the stacked layer of the first and second semiconductor layers 20, 25 are slightly horizontally etched. In a certain embodiment, the S/D regions are not recessed.

Figure 10:
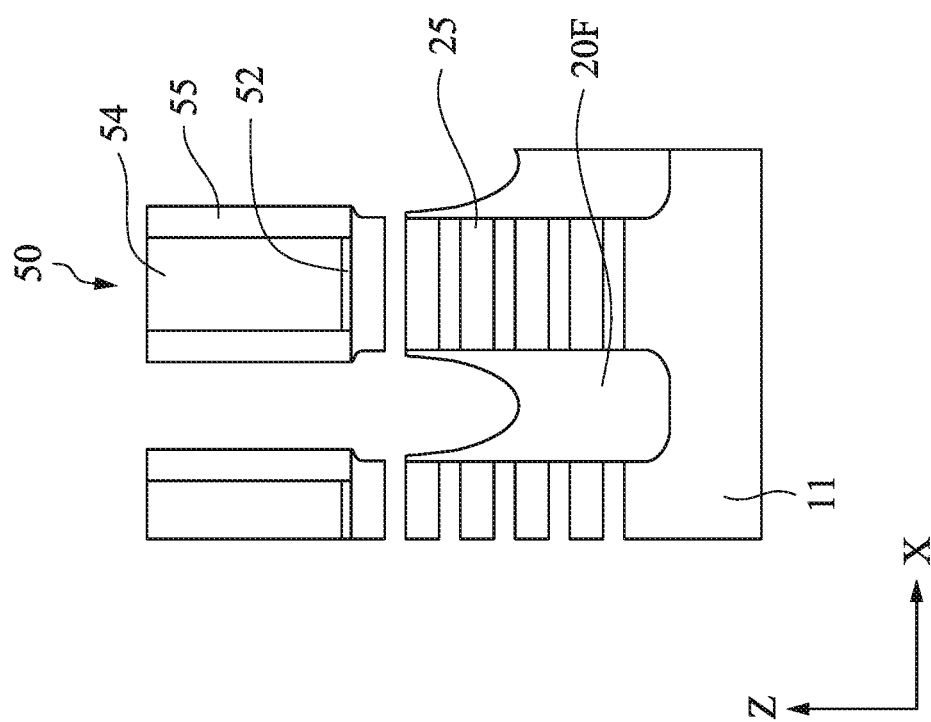

Subsequently, as shown in FIG. 10, a thermal operation (annealing) is performed to melt the first semiconductor layers 20, but not melt the second semiconductor layers 25, thereby removing the first semiconductor layers 20 from the channel region under the sacrificial gate structure.

When the first semiconductor layers 20 is made of Ge and the second semiconductor layers 25 are made of $Si_xGe_{1-x}$ (x=0.25), the structure (substrate 10) is heated to about 1000° C. in some embodiments. By applying the heat, the Ge layers 20 are melted and flow out from the stacked structure, and after cooling, the once melted Ge (recrystallized) forms source/drain regions 20F, as shown in FIG. 10. The $Si_xGe_{1-x}$ second semiconductor layers 25 remain intact because the melting point of $Si_xGe_{1-x}$ is greater than the melting point of Ge (see, FIG. 20). The source/drain region 20F has a tapered structure such that a thickness of the source/drain region decreases as a distance from the sacrificial gate structure increases.

The thermal process to melt the first semiconductor layer 20 is performed by laser annealing and/or rapid thermal annealing. The temperature set in the laser annealing and/or rapid thermal annealing is adjusted to such a temperature that the first semiconductor layer 20 melts but the second semiconductor layer 25 does not melt. The thermal process is performed in an inert gas ambient, such as He, Ar, $N_2$ and/or $H_2$ at atmospheric pressure, for about 1-5 minutes. In some embodiments, a reduced pressure condition is used.

Figure 11:
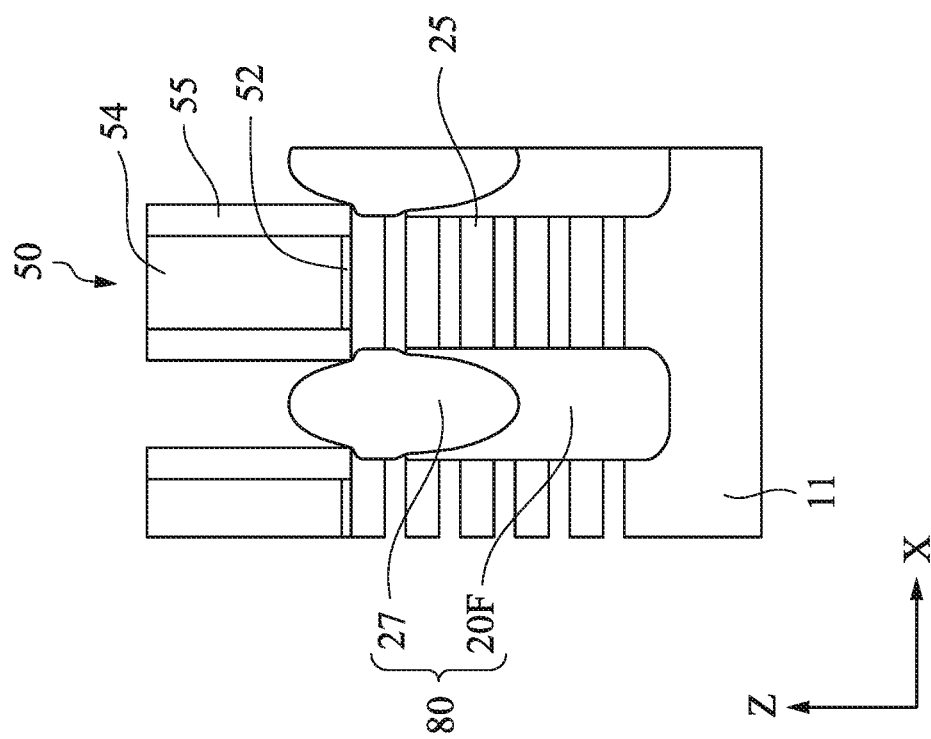

If the volume of the source/drain region 20F is not sufficient, an additional source/drain semiconductor layer 27 is formed on the source/drain region 20F, as shown in FIG. 11. The additional source/drain semiconductor layer 27 is epitaxially formed. A material of the additional source/drain semiconductor layer 27 can be the same as the first semiconductor layers 20 (the source/drain region 20F) or can be different. In some embodiments, the additional source/drain semiconductor layer 27 is not formed. The additional source/drain semiconductor layer 27 can be formed by an epitaxial growth method using CVD, ALD or molecular beam epitaxy (MBE). Hereinafter, the combination of the additional source/drain semiconductor layer 27 and the source/drain region 20F is referred to as a source/drain structure 80.

Figure 12:
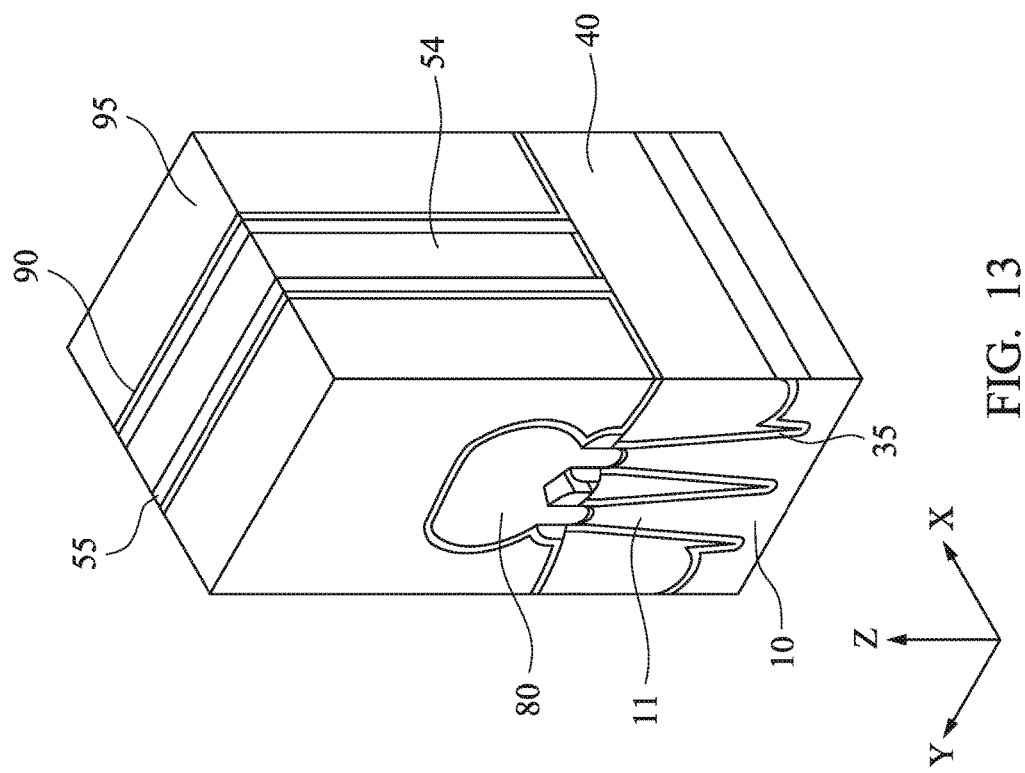

FIG. 12 shows a perspective view after the source/drain (S/D) structures 80 are formed. As shown in FIG. 12, the adjacent S/D structures 80 merge above the isolation insulating layer in some embodiments. Further, in certain embodiments, a void 82 is formed.

Figure 13:
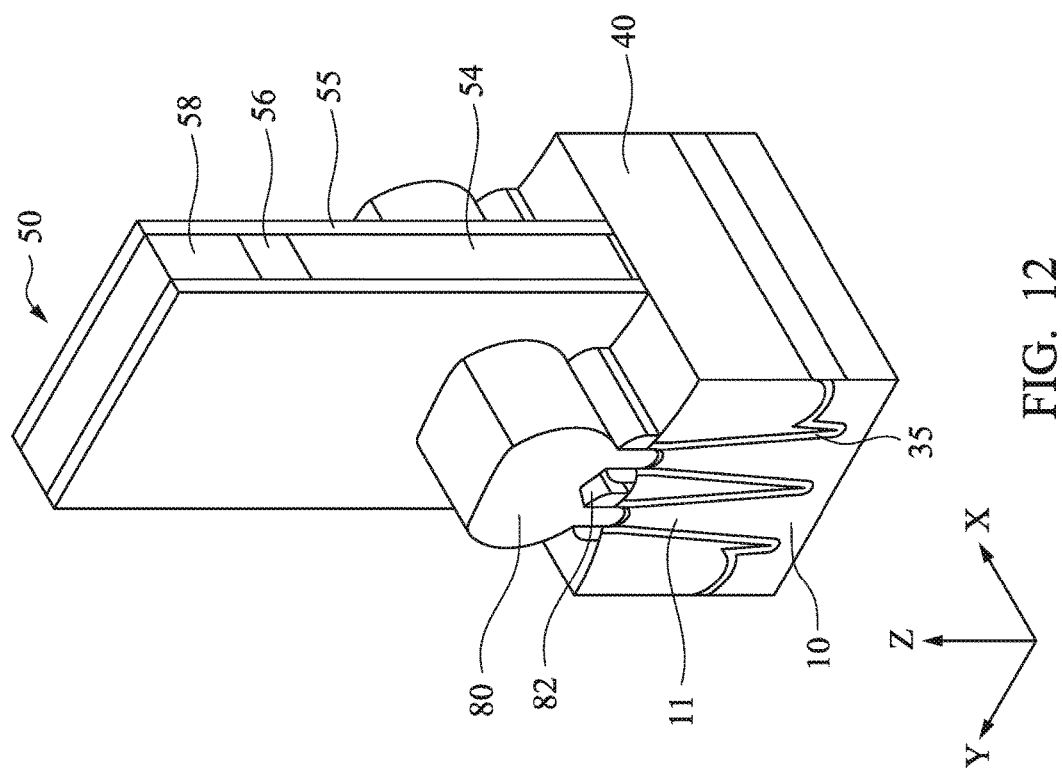

Subsequently, a second liner layer 90 is formed and then an interlayer dielectric (ILD) layer 95 is formed, as shown in FIG. 13. The second liner layer 90 is made of a silicon nitride-based material, such as SiN, and functions as a contact etch stop layer in subsequent etching operations.

The materials for the ILD layer 95 include compounds comprising Si, 0, C and/or H, such as silicon oxide, SiCOH and SiOC.

After the ILD layer 95 is formed, a planarization operation, such as CMP, is performed, so that the top portion of the sacrificial gate electrode layer 54 is exposed.

Next, as shown in FIGS. 14A and 14B, the sacrificial gate electrode layer 54 and sacrificial gate dielectric layer 52 are removed, thereby exposing the second semiconductor layer 25.

The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

In some embodiments, in removing the first semiconductor layers 20 from the channel region as explained with FIG. 10, the first semiconductor layers 20 are not completely removed from the channel region. In such a case, after the sacrificial gate structure 50 is removed, the residual first semiconductor layers in the channel region are removed by dry and/or wet etching. When the first semiconductor layers 20 are Ge and the second semiconductor layers 25 are SiGe, the residual first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution.

Figure 15:
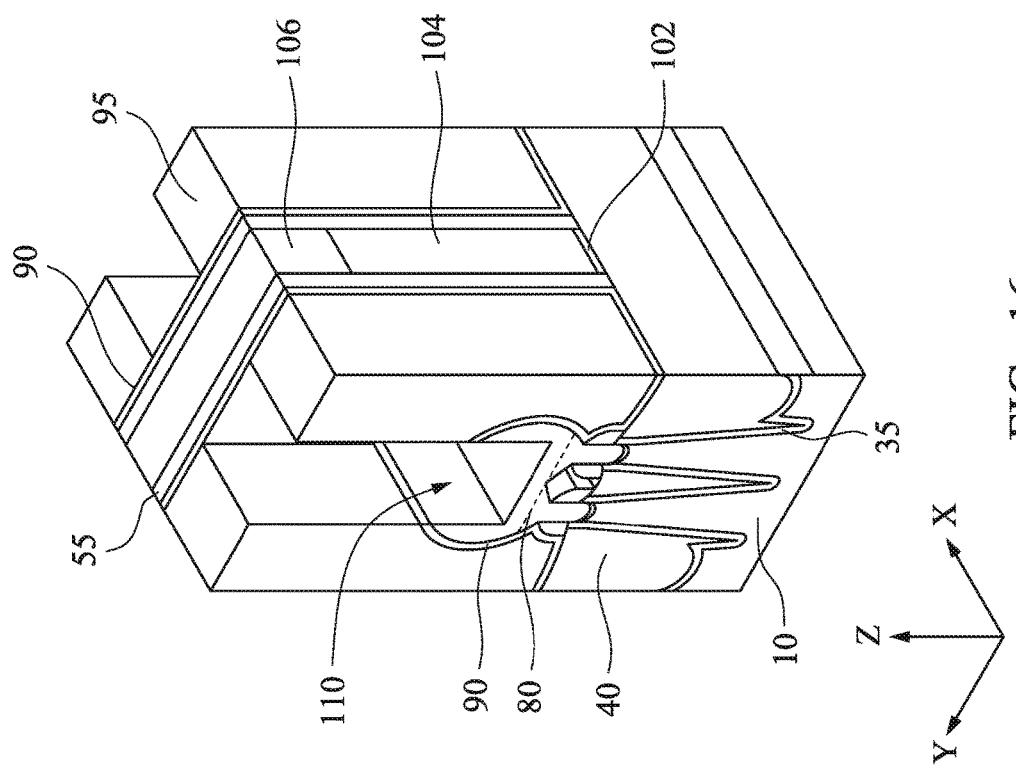

After the wires of the second semiconductor layers 25 are exposed, a gate dielectric layer 102 is formed around each channel layers (wires of the second semiconductor layers 25), and a gate electrode layer 104 is formed on the gate dielectric layer 102, as shown in FIG. 15.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layers. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode layer 104 is recessed and a cap insulating layer 106 is formed over the recessed gate electrode 104, as shown in FIG. 15. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. In certain embodiments, the work function adjustment layer may be formed separately for the n-channel FET, and the p-channel FET which may use different metal layers.

Figure 16:
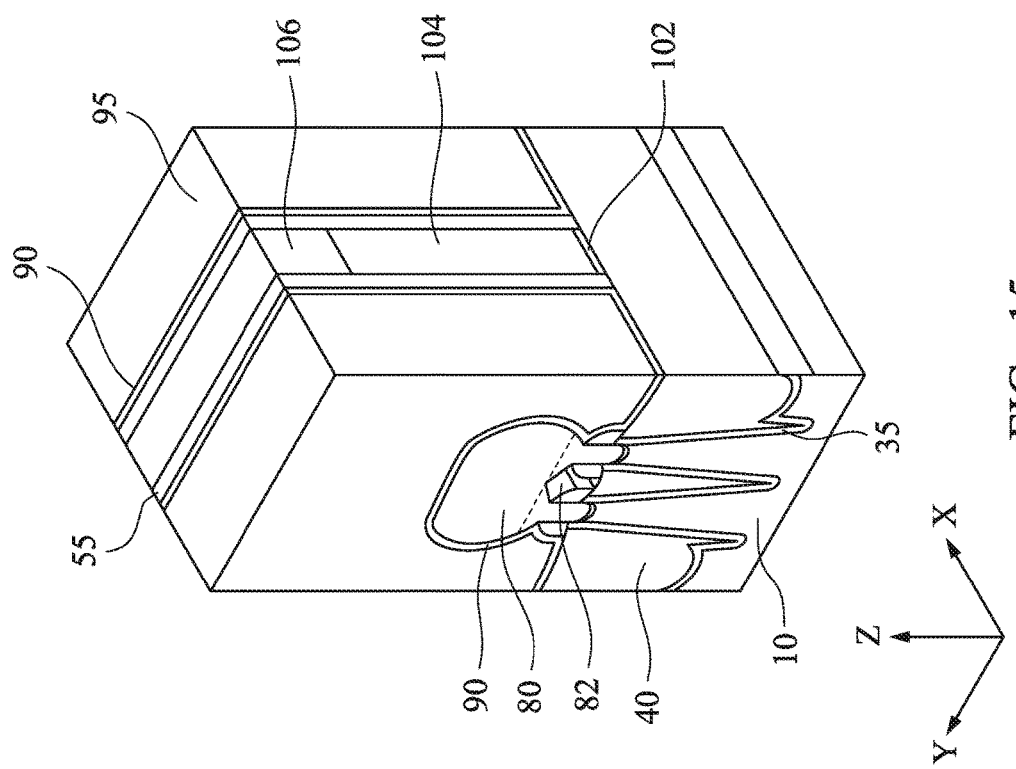

Subsequently, contact holes 110 are formed in the ILD layer 95 by using dry etching, as shown in FIG. 16. In some embodiments, the upper portion of the S/D structure 80 is etched.

Figure 17:
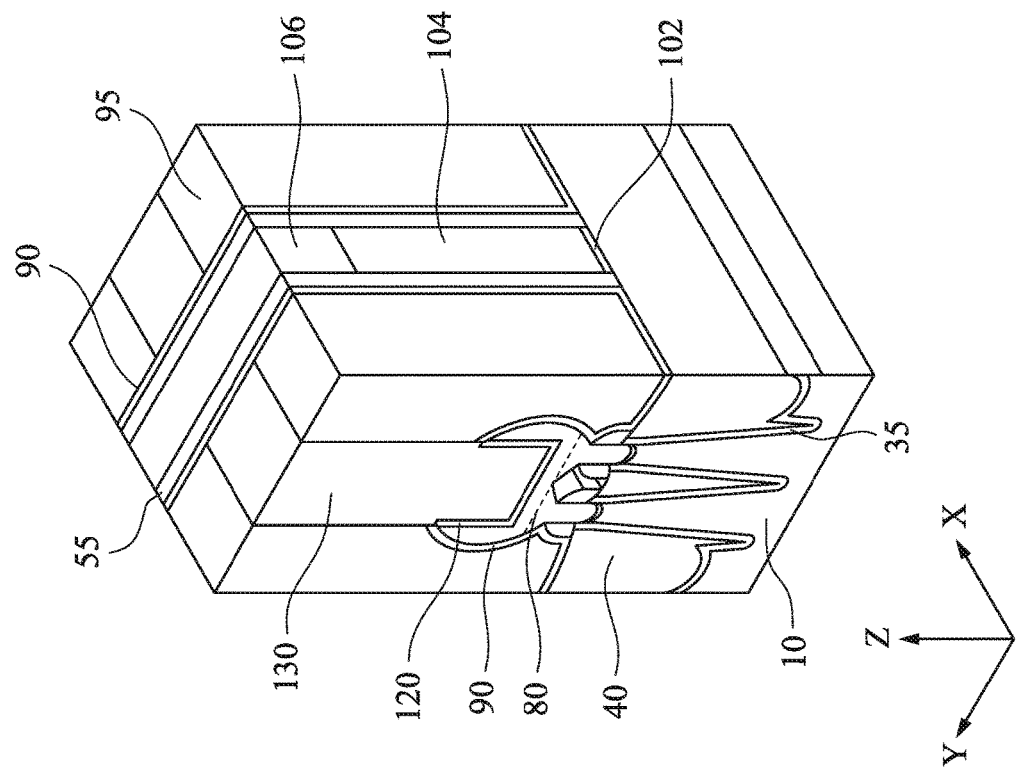
Figure 18:
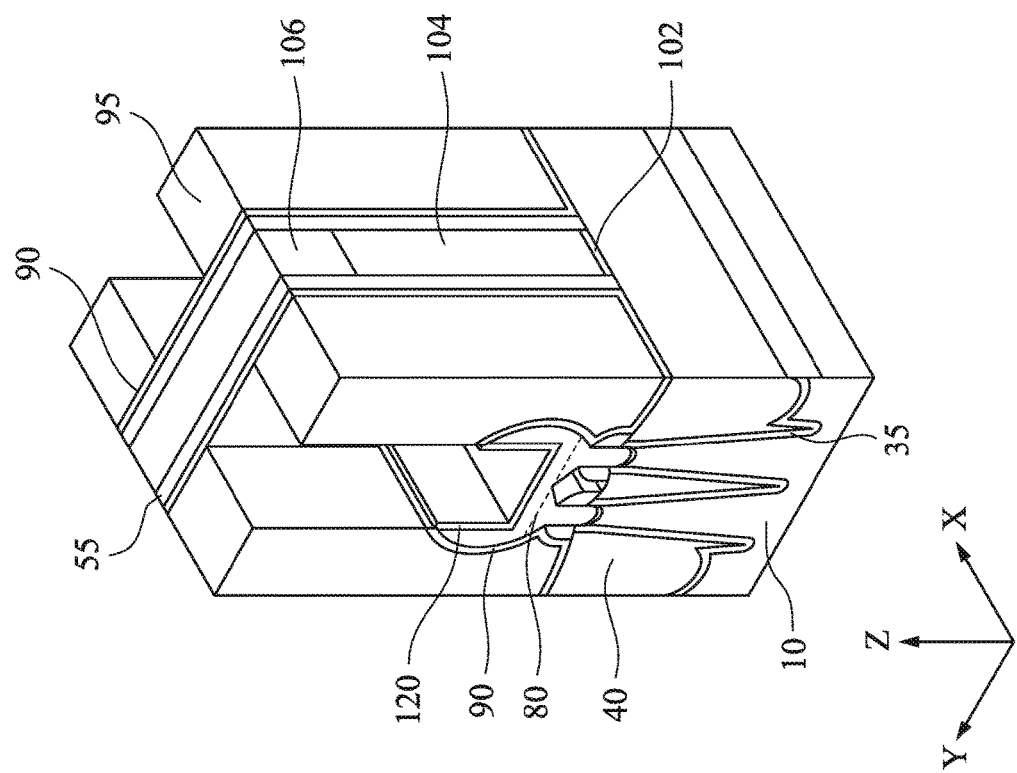

A silicide layer 120 is formed over the S/D structure 80, as shown in FIG. 17. The silicide layer includes one or more of WSi, CoSi, NiSi, TiSi, MoSi and TaSi. Then, a conductive material 130 is formed in the contact holes as shown in FIG. 18. The conductive material 130 includes one or more of Co, Ni. W, Ti, Ta, Cu, Al, TiN and TaN.

Figure 19A:
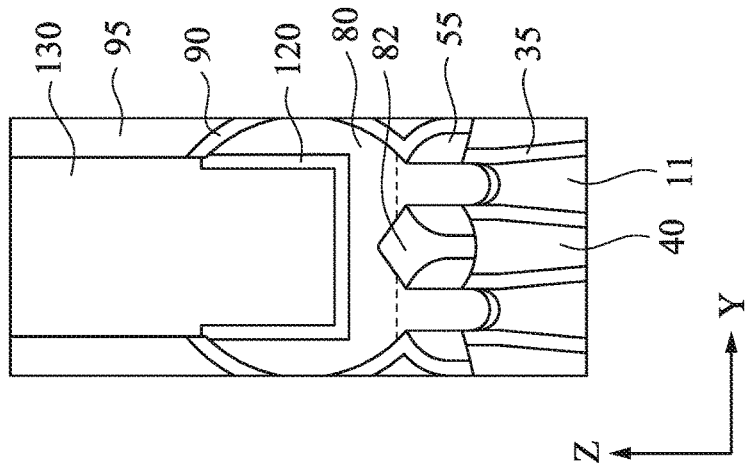
Figure 19B:
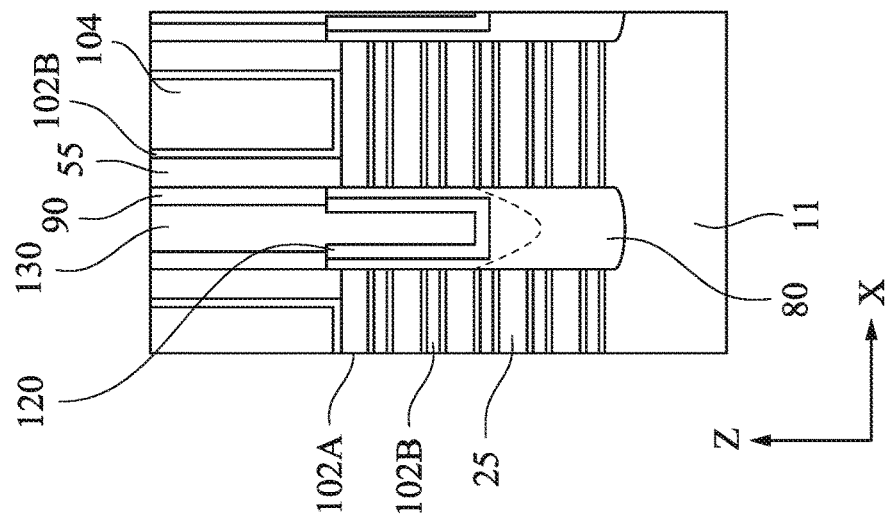
Figure 19C:
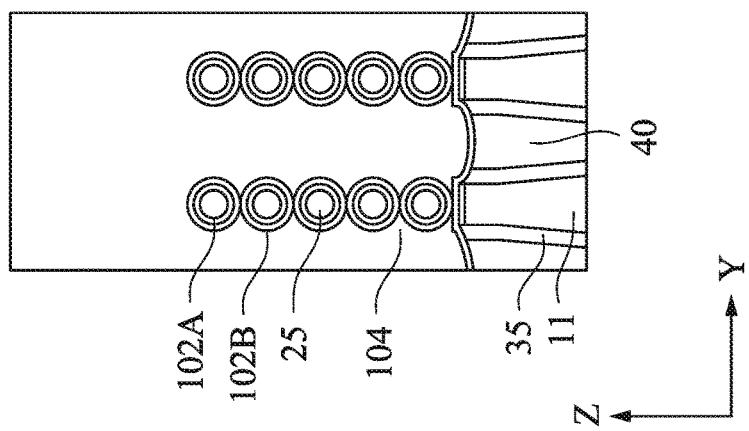

FIGS. 19A-19C show cross sectional views of the structure of FIG. 18. FIG. 19A shows the cross sectional view cutting the gates along the Y direction, FIG. 19B shows the cross sectional view cutting the gates along the X direction and FIG. 19C shows the cross sectional view cutting the S/D region along the Y direction.

As shown in FIG. 19A, the wires made of the second semiconductor layer 25 are stacked in the Z direction. It is noted that the second semiconductor layers 25 may also be etched when the first semiconductor layer 20 are removed, and thus the corners of the second semiconductor layers 25 are rounded. An interfacial layer 102A wraps around each of the wires, and the gate dielectric layer 102B covers the interfacial layer 102A. Although the gate dielectric layer 120B wrapping around one wire is in contact with that of the adjacent wire in FIG. 19A, the structure is not limited to FIG. 19A. In other embodiments, the gate electrode 104 also wraps around each of the wires covered by the interfacial layer 102A and the gate dielectric layer 102B.

It is understood that the GAA FETs undergoes further CMOS processes to form various features such as contacts/vias, interconnect metal layers, dielectric layers, passivation layers, etc.

The various embodiments or examples described herein offer several advantages over the existing art. For example, in the present disclosure, since the first semiconductor layers 20 are removed by melting, the first semiconductor layer 20 can be removed with a higher selectivity against the second semiconductor layers 25.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a stacked structure of first semiconductor layers and second semiconductor layers alternately stacked is formed in a first direction over a substrate. The stacked structure is patterned into a fin structure extending in a second direction perpendicular to the first direction. A sacrificial gate structure is formed over the fin structure such that the sacrificial gate structure covers a part of the fin structure. The part of the fin structure covered by the sacrificial gate structure is a channel region. The first semiconductor layers are melted by applying heat, thereby removing the first semiconductor layers from the channel region and forming a source/drain region made of a material of the first semiconductor. A dielectric layer is formed to cover the source/drain region and the sacrificial gate structure. The sacrificial gate structure is removed to expose the second semiconductor layers in the channel region of the fin structure. A gate dielectric layer and a gate electrode layer are formed around the exposed second semiconductor layers in the channel region. A melting point of the first semiconductor layers is lower than a melting point of the second semiconductor layers, and the applying heat does not melt the second semiconductor layers.

In accordance with another one aspect of the present disclosure, in a method of manufacturing a semiconductor device, a stacked structure of first semiconductor layers and second semiconductor layers alternately stacked is formed in a first direction over a substrate. The stacked structure is patterned into a fin structure extending in a second direction perpendicular to the first direction. An isolation insulating layer is formed such that an upper portion of the fin structure is exposed from the isolation insulating layer and a lower portion of the fin structure is embedded in the isolation insulating layer. A sacrificial gate structure is formed over the fin structure such that the sacrificial gate structure covers a part of the fin structure. The part of the fin structure covered by the sacrificial gate structure is a channel region. A sidewall spacer layer is formed over the sacrificial gate structure and the fin structure not covered by the sacrificial gate structure. The fin structure not covered by the sacrificial gate structure is recessed into the substrate by removing the sidewall spacer formed thereon and the first and second semiconductor layers. The first semiconductor layers are melted by applying heat, thereby removing the first semiconductor layers from the channel region and forming a source/drain region made of a material of the first semiconductor. A dielectric layer is formed to cover the source/drain region and the sacrificial gate structure. The sacrificial gate structure is removed to expose the second semiconductor layers in the channel region of the fin structure. A gate dielectric layer and a gate electrode layer are formed around the exposed second semiconductor layers in the channel region. A melting point of the first semiconductor layers is lower than a melting point of the second semiconductor layers, and the applying heat does not melt the second semiconductor layers.

In accordance with another aspect of the present disclosure, a semiconductor device includes a first channel layer disposed over a substrate, a first source/drain region disposed over the substrate, a gate dielectric layer disposed on and wrapping the first channel layer, and a gate electrode layer disposed on the gate dielectric layer and wrapping the first channel layer. The first channel layer includes a semiconductor wire made of a first semiconductor material. The first source/drain region includes a second semiconductor material different from the first semiconductor material. The first source/drain region has a tapered structure such that a thickness of the first source/drain region decreases as a distance from the gate electrode layer increases.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a stacked structure of first semiconductor layers and second semiconductor layers alternately stacked in a first direction over a substrate;
    patterning the stacked structure into a fin structure extending in a second direction perpendicular to the first direction;
    forming a sacrificial gate structure over the fin structure such that the sacrificial gate structure covers a part of the fin structure, the part of the fin structure covered by the sacrificial gate structure being a channel region;
    melting the first semiconductor layers by applying heat, thereby removing the first semiconductor layers from the channel region and forming a source/drain region made of a material of the first semiconductor;
    forming a dielectric layer to cover the source/drain region and the sacrificial gate structure;
    removing the sacrificial gate structure to expose the second semiconductor layers in the channel region of the fin structure; and
    forming a gate dielectric layer and a gate electrode layer around the exposed second semiconductor layers in the channel region, wherein:
    a melting point of the first semiconductor layers is lower than a melting point of the second semiconductor layers, and
    the applying heat does not melt the second semiconductor layers.

2. The method of claim 1, wherein an uppermost layer in the stacked structure is one of the second semiconductor layers.

3. The method of claim 1, wherein a difference between the melting point of the first semiconductor layers and the melting point of the second semiconductor layers is 20° C. or more.

4. The method of claim 3, wherein the first semiconductor layers are made of Ge or $Si_xGe_{1-x}$, and the second semiconductor layers are made of Si or $Si_yGe_{1-y}$, where $x<y$.

5. The method of claim 1, wherein the first semiconductor layers are made of Ge and the second semiconductor layers are made of $Si_xGe_{1-x}$, where $0.1 \leq x \leq 0.32$.

6. The method of claim 5, wherein:
a thickness of the first semiconductor layers is in a range from 4 nm to 8 nm,
a thickness of the second semiconductor layers is in a range from 2 nm to 6 nm, and
the thickness of the first semiconductor layers is in greater than the thickness of the second semiconductor layers.

7. The method of claim 1, wherein a thickness of the first semiconductor layers is greater than a thickness of the second semiconductor layers.

8. The method of claim 1, wherein a width of the fin structure is in a range from 2 nm to 10 nm.

9. The method of claim 1, wherein at least one of the first and second semiconductor layers includes a Group III-V semiconductor.

10. The method of claim 1, wherein:
the sacrificial gate structure extends in a third direction perpendicular to the first and second directions, and
a width of the sacrificial gate structure in the second direction is in a range from 10 nm to 100 nm.

11. A method of manufacturing a semiconductor device, comprising:
forming a stacked structure of first semiconductor layers and second semiconductor layers alternately stacked in a first direction over a substrate;
patterning the stacked structure into a fin structure extending in a second direction perpendicular to the first direction;
forming an isolation insulating layer such that an upper portion of the fin structure is exposed from the isolation insulating layer and a lower portion of the fin structure is embedded in the isolation insulating layer;
forming a sacrificial gate structure over the fin structure such that the sacrificial gate structure covers a part of the fin structure, the part of the fin structure covered by the sacrificial gate structure being a channel region;
forming a sidewall spacer layer over the sacrificial gate structure and the fin structure not covered by the sacrificial gate structure;
recessing the fin structure not covered by the sacrificial gate structure into the substrate by removing the sidewall spacer formed thereon and the first and second semiconductor layers;
melting the first semiconductor layers by applying heat, thereby removing the first semiconductor layers from the channel region and forming a source/drain region made of a material of the first semiconductor;
forming a dielectric layer to cover the source/drain region and the sacrificial gate structure;
removing the sacrificial gate structure to expose the second semiconductor layers in the channel region of the fin structure; and
forming a gate dielectric layer and a gate electrode layer around the exposed second semiconductor layers in the channel region, wherein:
a melting point of the first semiconductor layers is lower than a melting point of the second semiconductor layers, and
the applying heat does not melt the second semiconductor layers.

12. The method of claim 11, wherein the applying heat is performed by laser annealing.

13. The method of claim 11, wherein the applying heat is performed by rapid thermal annealing.

14. The method of claim 11, wherein the applying heat is performed in an inert gas ambient.

15. The method of claim 11, further comprising, after the melting the first semiconductor layers and before forming the dielectric layer, forming an additional source/drain semiconductor layer on the source/drain region.

16. The method of claim 15, wherein a material of the additional source/drain semiconductor layer on the source/drain region is the same as the first semiconductor layers.

17. The method of claim 15, wherein a material of the additional source/drain semiconductor layer on the source/drain region is different from the first semiconductor layers.

18. The method of claim 11, wherein:
in the removing the first semiconductor layers, the first semiconductor layers are not completely removed from the channel region, and
the method further comprises, after the removing the sacrificial gate structure and before forming the gate dielectric layer, removing the first semiconductor layers that remain in the channel region.

19. A method of manufacturing nano-wire structures, comprising:
forming a stacked structure of first semiconductor layers and second semiconductor layers alternately stacked in a first direction over a substrate, the stacked structure having a width in a range from 2 nm to 10 nm;
forming support structures at both ends of the stacked structure; and
melting the first semiconductor layers by applying heat, thereby removing the first semiconductor layers and forming the nano-wire structures made of the second semiconductor layers.

20. The method of claim 19, wherein the first semiconductor layers are made of Ge or $Si_xGe_{1-x}$, and the second semiconductor layers are made of Si or $Si_yGe_{1-y}$, where $x<y$.

* * * * *